United States Patent
Rafi et al.

(10) Patent No.: US 11,038,521 B1
(45) Date of Patent: Jun. 15, 2021

(54) SPUR AND QUANTIZATION NOISE CANCELLATION FOR PLLS WITH NON-LINEAR PHASE DETECTION

(71) Applicant: Silicon Laboratories Inc., Austin, TX (US)

(72) Inventors: Aslamali A. Rafi, Austin, TX (US); Srisai R. Seethamraju, Nashua, NH (US); Russell Croman, Buda, TX (US); James D. Barnette, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/805,336

(22) Filed: Feb. 28, 2020

(51) Int. Cl.
*H03M 3/00* (2006.01)
*H03L 7/093* (2006.01)
*H03L 7/197* (2006.01)

(52) U.S. Cl.
CPC ............ *H03M 3/322* (2013.01); *H03L 7/093* (2013.01); *H03L 7/1974* (2013.01); *H03M 3/358* (2013.01); *H03M 3/368* (2013.01); *H03M 3/376* (2013.01)

(58) Field of Classification Search
CPC ..... H03L 7/093; H03L 7/085; H03L 2207/50; H03L 7/1974; H03M 1/0836; H03M 1/0854; H03M 1/0863; H03M 3/358; H03M 3/366; H03M 3/368; H03M 3/376; H03M 3/37; H03M 7/3004; H03M 7/3006; H03M 7/301

See application file for complete search history.

(56) References Cited

U.S. PATENT DOCUMENTS

| 3,508,195 A | 4/1970 | Sellers |
| 4,301,466 A | 11/1981 | Lemoine et al. |
| 5,467,373 A | 11/1995 | Ketterling |
| 5,576,666 A | 11/1996 | Rauvola |

(Continued)

OTHER PUBLICATIONS

Gupta, M. and Song, B.S., "A 1.8GHz Spur Cancelled Fractional-N Frequency Synthesizer with LMS Based DAC Gain Calibration," IEEE International Solid-State Circuits Conference, vol. 41, No. 12, Dec. 2006, pp. 2842-2851.

(Continued)

*Primary Examiner* — Ryan Johnson
(74) *Attorney, Agent, or Firm* — Zagorin Cave LLP

(57) ABSTRACT

A fractional-N phase-locked loop (PLL) has a time-to-voltage converter with second order non linearity. The time-to voltage-converter provides an analog error signal indicating a phase difference between the reference clock signal with a period error and a feedback signal supplied by a fractional-N feedback divider. The spur results in quantization noise associated with the fractional-N feedback divider being frequency translated. To address the frequency translated noise, a spur cancellation circuit receives a residue signal indicative of the quantization noise and a spur signal indicative of the spur. The non-linearity of the time-to-voltage converter is mimicked digitally through terms of a polynomial generated to cancel the noise. The generated polynomial is coupled to a delta sigma modulator that controls a digital to analog converter that adds/subtracts a voltage value to/from the error signal to thereby cancel the quantization noise including the frequency translated quantization noise.

20 Claims, 13 Drawing Sheets

(56) References Cited

U.S. PATENT DOCUMENTS

| | | |
|---|---|---|
| 6,515,525 B2 | 2/2003 | Hasegawa |
| 6,829,318 B2 | 12/2004 | Kawahara |
| 7,061,276 B2 | 6/2006 | Xu |
| 7,064,616 B2 | 6/2006 | Reichert |
| 7,208,990 B1 | 4/2007 | Hassun |
| 7,391,839 B2 | 6/2008 | Thompson |
| 7,545,190 B2 | 6/2009 | Chiang et al. |
| 7,605,662 B2 | 10/2009 | Kobayashi et al. |
| 7,746,972 B1 | 6/2010 | Melanson et al. |
| 7,888,973 B1 | 2/2011 | Rezzi |
| 8,207,766 B2 | 6/2012 | Yu |
| 8,390,348 B2 | 3/2013 | Burcea |
| 8,427,243 B2 | 4/2013 | Chen et al. |
| 8,497,716 B2 | 7/2013 | Zhang |
| 8,604,840 B2 | 12/2013 | Ahmadi et al. |
| 8,947,139 B1 | 2/2015 | Vercesi et al. |
| 8,957,712 B2 | 2/2015 | Tang et al. |
| 9,065,457 B2 * | 6/2015 | Namdar-Mehdiabadi ............... H03L 7/1978 |
| 9,071,195 B2 | 6/2015 | Gabbay |
| 9,207,646 B2 | 12/2015 | Wang et al. |
| 9,246,500 B2 | 1/2016 | Perrott |
| 9,490,818 B2 | 11/2016 | Perrott |
| 9,634,678 B1 | 4/2017 | Caffee et al. |
| 9,762,250 B2 | 9/2017 | Perrott |
| 9,923,563 B1 | 3/2018 | Horovitz et al. |
| 10,581,418 B2 * | 3/2020 | Wu .................. H03L 7/0805 |
| 10,594,329 B1 * | 3/2020 | Elkholy ............. H03M 3/358 |
| 10,840,897 B1 | 11/2020 | Rafi |
| 2002/0000800 A1 | 1/2002 | Hill |
| 2002/0097826 A1 | 7/2002 | Iwata et al. |
| 2003/0112045 A1 | 6/2003 | Atallah et al. |
| 2007/0090866 A1 | 4/2007 | Park et al. |
| 2008/0061850 A1 | 3/2008 | Watanabe |
| 2008/0116946 A1 | 5/2008 | Masson |
| 2008/0129352 A1 | 6/2008 | Zhang |
| 2008/0218228 A1 | 9/2008 | Masson |
| 2009/0132884 A1 | 5/2009 | Suda et al. |
| 2009/0251225 A1 | 10/2009 | Chen et al. |
| 2010/0061499 A1 | 3/2010 | Mijuskovik |
| 2010/0097150 A1 | 4/2010 | Ueda et al. |
| 2010/0164579 A1 | 7/2010 | Acatrinel |
| 2010/0213984 A1 | 8/2010 | Shin et al. |
| 2010/0264963 A1 | 10/2010 | Kikuchi et al. |
| 2011/0025388 A1 | 2/2011 | Lamanna |
| 2011/0074479 A1 | 3/2011 | Yun et al. |
| 2011/0109354 A1 | 5/2011 | Feng et al. |
| 2011/0109356 A1 | 5/2011 | Ali et al. |
| 2011/0133799 A1 | 6/2011 | Dunworth et al. |
| 2011/0204938 A1 | 8/2011 | Lamanna |
| 2011/0204948 A1 | 8/2011 | Satoh et al. |
| 2011/0227612 A1 | 9/2011 | Chiesa |
| 2011/0234272 A1 | 9/2011 | Yu |
| 2012/0153999 A1 | 6/2012 | Kim |
| 2012/0161832 A1 | 6/2012 | Lee et al. |
| 2013/0050013 A1 | 2/2013 | Kobayashi et al. |
| 2013/0112472 A1 | 5/2013 | Welland |
| 2013/0222026 A1 | 8/2013 | Havens |
| 2013/0257494 A1 | 10/2013 | Nikaeen et al. |
| 2014/0038534 A1 | 2/2014 | Ciacci et al. |
| 2014/0077849 A1 | 3/2014 | Chen et al. |
| 2014/0211899 A1 | 7/2014 | Furudate |
| 2014/0218094 A1 | 8/2014 | Oppelt |
| 2014/0266341 A1 | 9/2014 | Jang et al. |
| 2014/0268936 A1 | 9/2014 | Lu |
| 2015/0145567 A1 | 5/2015 | Perrott |
| 2015/0145571 A1 | 5/2015 | Perrott |
| 2015/0207514 A1 | 7/2015 | Kim et al. |
| 2015/0008961 A1 | 8/2015 | Kim et al. |
| 2016/0112053 A1 | 4/2016 | Perrott |
| 2016/0359493 A1 | 12/2016 | Chen et al. |
| 2018/0367614 A1 | 12/2018 | Millar |
| 2019/0068205 A1 | 2/2019 | Tamura et al. |

OTHER PUBLICATIONS

Hedayati, H. et al., "A 1 MHz Bandwidth, 6 GHz 0.18 μm CMOS Type-I ΔΣ Franctional-N Synthesizer for WiMAX Applications," IEEE Journal of Solid State Circuits, vol. 44, No. 12, Dec. 2009, pp. 3244-3252.

Hedayati, H. and Bakkaloslu, B., "A 3GHz Wideband ΣΔ Fractional-N Synthesizer with Voltage-Mode Exponential CP-PFD", IEEE Radio Frequency Integrated Circuits Symposium, 2009, pp. 325-328.

Hsu, C.M. et al., "A Low-Noise Wide-BW 3.6-GHz Digital ΔΣ Fractional-N Frequency Synthesizer with a Noise-Shaping Time-to-Digital Converter and quantization Noise Cancellation," IEEE Journal of Solid-State Circuits, vol. 43, No. 12, Dec. 2008, pp. 2776-2786.

Menninger, S. and Perrott, M., "A 1-MHz Bandwidth 3.6-GHz 0.18 μm CMOS Fractional-N Synthesizer Utilizing a Hybrid PFD/DAC Structure for Reduced Broadband Phase Noise," IEEE Journal of Solid-State Circuits, vol. 41, No. 4, Apr. 2006, pp. 966-980.

Pamarti et al., "A wideband 2.4GHz Delta-Sigma Fractional-N PLL with 1 Mb/s In-Loop Modulation," IEEE Journal of Solid-State Circuits, vol. 39, No. 1, Jan. 2004, pp. 49-62.

Staszewski, R.B. et al., "All-Digital PLL and Transmitter for Mobile Phones," IEEE Journal of Solid-State Circuits, vol. 40, No. 12, Dec. 2005, pp. 2469-2482.

Staszewski, R.B. et al., "1.3 V, 20 ps Time-to-Digital Converter for Frequency Synthesis in 90-nm CMOS," IEEE Transactions on Circuits and Systems—II, Express Briefs, vol. 53, No. 3, Mar. 2006, pp. 220-224.

Straayer, M.Z. and Perrott, M.H., A 12-Bit, 10-MHz Bandwidth, Continuous-Time ΣΔ ADC With a 5-Bit, 950-MS/s VCO-Based Quantizer, IEEE Journal of Solid-State Circuits, vol. 43, No. 4, Apr. 2008, pp. 805-814.

Swaminathan et al., "A Wide-Bandwidth 24 GHz ISM Band Fractional-N PLL with Adaptive Phase Noise Cancellation", IEEE Journal of Solid-State Circuits, vol. 42, No. 12, Dec. 2007, pp. 2639-2650.

Temporiti, E. et al., "A 700kHz Bandwith ΣΔ Fractional Synthesizer with Spurs Compensation and Linearization Techniques for WCDMA Applications," IEEE Journal of Solid-State Circuits, vol. 39, No. 9, Sep. 2004, pp. 1446-1454.

Avivi, R. et al., "Adaptive Spur Cancellation Technique in All-Digital Phase-Locked Loops," IEEE Transactions on Circuits and Systems—II: Express Briefs, vol. 64, No. 11, Nov. 2017, pp. 1291-1996.

Ho, C., and Chen, M., "A Fractional-N DPLL With Calibration-Free Multi-Phase Injection-Locked TDC and Adaptive Single-Tone Spur Cancellation Scheme," IEEE Transactions on Circuits and Systems—I: Regular Papers, vol. 63, No. 8, Aug. 2016, pp. 1111-1122.

Li, Y., et al., "On-Chip Spur and Phase Noise Cancellation Techniques," IEEE Asian Solid-State Circuits Conference, Nov. 6-8, 2017, pp. 109-112.

U.S. Appl. No. 16/593,473, entitled "Spur Cancellation in a PLL System with an Automatically Updated Target Spur Frequency," filed Oct. 4, 2019, by Timothy A. Monk and Douglas F. Pastorello.

U.S. Appl. No. 16/018,598, entitled "Spur Cancellation for Spur Measurement," filed Jun. 26, 2018, by Timothy A. Monk and Rajesh Thirugnanam.

U.S. Appl. No. 16/143,711, entitled "Spur Canceller with Multiplier-Less Correlator," filed Sep. 27, 2018, by Timothy A. Monk and Rajesh Thirugnanam.

U.S. Appl. No. 16/143,717, entitled "Spur Cancellation with Adaptive Frequency Tracking," filed Sep. 27, 2018, by Timothy A. Monk and Rajesh Thirugnanam.

IDT, "I2C Programmable Ethernet Clock Generator," 8T49N4811 Data Sheet, Revision A, Mar. 30, 2015, pp. 1-34.

Inti, R. et al., "A 0.5-to-2.5 Gb/s Reference-Less Half-Rate Digital CDR with Unlimited Frequency Acquisition Range and Improved Input Duty-Cycle Error Tolerance," IEEE Journal of Solid-State Circuits, vol. 46, No. 12, Dec. 2011, pp. 3150-3162.

Ma, S., "Feasibility Study of Frequency Doubling Using an AN XOR-Gate Method," MSc. Thesis, Jan. 2013, pp. 1-77.

(56) References Cited

OTHER PUBLICATIONS

Oortgiesen, R., "Feasibility Study of Frequency Doubling Using a Dual-Edge Method," MSc. Thesis, Nov. 2010, pp. 1-56.
Razavi, B., "RF Microelectronics," Second Editioin, Prentice Hall, 2012, pp. 664-667.
Wikipedia, "Phase-Locked Loop," https://en.wikipedia.org/wiki/Phase-locked_loop, downloaded Dec. 14, 2015, 17 pages.

* cited by examiner

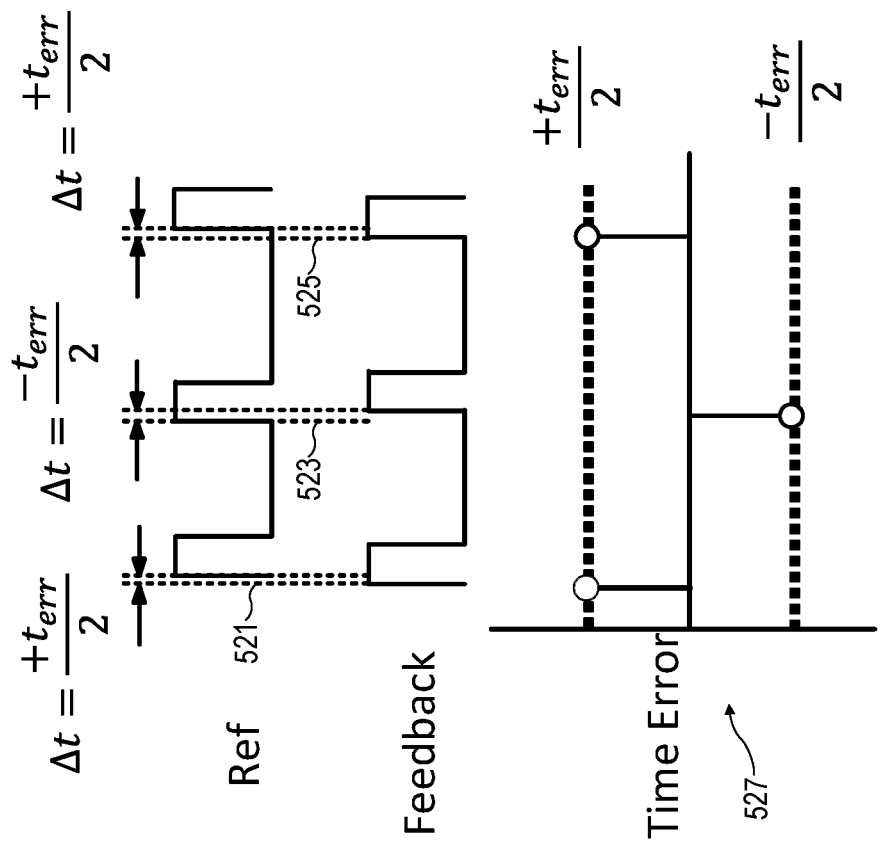
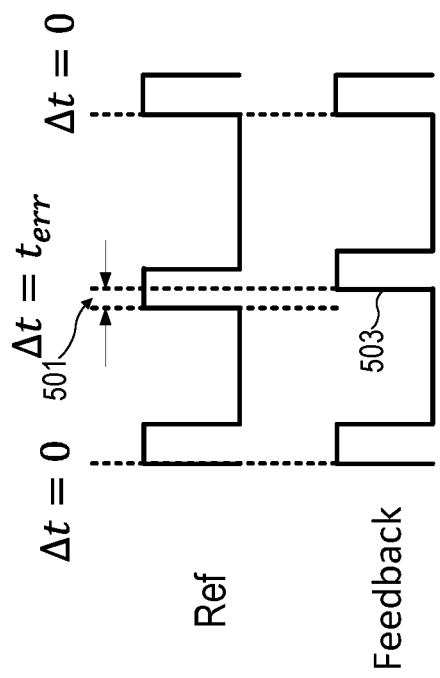
Fig. 5B
Fig. 5A $$C_{xx} = I + L + U$$
$$C_{xx}\Delta h = (I + L + U)h = C_{ex}$$
$$\boxed{\Delta h^{m+1} = C_{ex} - L\Delta h^{m+1} - U\Delta h^m}$$

1001

SPUR AND QUANTIZATION NOISE CANCELLATION FOR PLLS WITH NON-LINEAR PHASE DETECTION

BACKGROUND

Field of the Invention

This application relates to quantization noise cancellation and spur cancellation in a phase-locked loop.

Description of the Related Art

Today's high data rate wire-line and wireless communication systems require a clock source with a low rms jitter performance. Such applications typically use fractional-N phased-lock loops (PLLs) since fractional-N PLLs enable very high frequency resolution. However, by their very nature fractional-N PLLs also have to deal with the large quantization noise resulting from the implementation of the fractional feedback divider value. Furthermore, in order to reduce the noise contribution from the charge pump and the blocks following the phase detector, a high gain sampling phase detector is often used in such PLLs.

SUMMARY OF EMBODIMENTS OF THE INVENTION

In order to better cancel quantization noise, an embodiment provides a method of operating a phase-locked loop (PLL) that includes generating a polynomial indicative of noise to be canceled, the noise including quantization noise and frequency translated quantization noise. The quantization noise is associated with a first delta sigma modulator controlling a feedback divider in the PLL. Generating the polynomial includes combining a signal indicative of a spur and a residue term indicative of the quantization noise, the spur being present in a reference clock signal being supplied to a phase and frequency detector of the PLL. The method further includes cancelling the quantization noise and the frequency translated quantization noise in an analog error signal in the PLL based on the polynomial.

In another embodiment a method is provided that includes generating a polynomial for use in canceling quantization noise in a PLL analog error signal indicative of a phase difference between a reference clock signal and a feedback signal. The quantization noise is associated with a delta sigma modulator controlling a feedback divider in the PLL that supplies the feedback signal. The polynomial is further used in canceling frequency translated quantization noise present, in part, due to a spur in the reference clock signal that is being supplied to an input of a phase and frequency detector of the PLL. The method further includes canceling the quantization noise and frequency translated quantization noise based on the polynomial that is generated.

In another embodiment a phase-locked loop (PLL) is provided that includes an oscillator and a time to voltage converter. The time to voltage converter has a phase and frequency detector (PFD) that receives a feedback signal and a reference clock signal and the time to voltage converter supplies a voltage error signal indicative of a phase difference between the reference clock signal and the feedback signal. A feedback divider is coupled to an output of the oscillator and configured to supply the feedback signal. A spur cancellation circuit is configured to receive a dither signal, a residue signal indicative of quantization noise associated with a first delta sigma modulator controlling the feedback divider and to receive a spur signal indicative of a spur that is present in the reference clock signal. The spur cancellation circuit is configured to generate a cancellation polynomial indicative of noise to be canceled, the noise to be canceled including quantization noise and frequency translated quantization noise.

BRIEF DESCRIPTION OF THE DRAWINGS

The present invention may be better understood, and its numerous objects, features, and advantages made apparent to those skilled in the art by referencing the accompanying drawings.

FIG. 5A illustrates that a DC time error supplied to a type II PLL results in the feedback pulse moving to the right.

FIG. 5B illustrates a duty cycle error on even and odd pulses that results in a discrete time square wave error term to appear at the phase detector input.

The use of the same reference symbols in different drawings indicates similar or identical items.

DETAILED DESCRIPTION

Figure 1A:
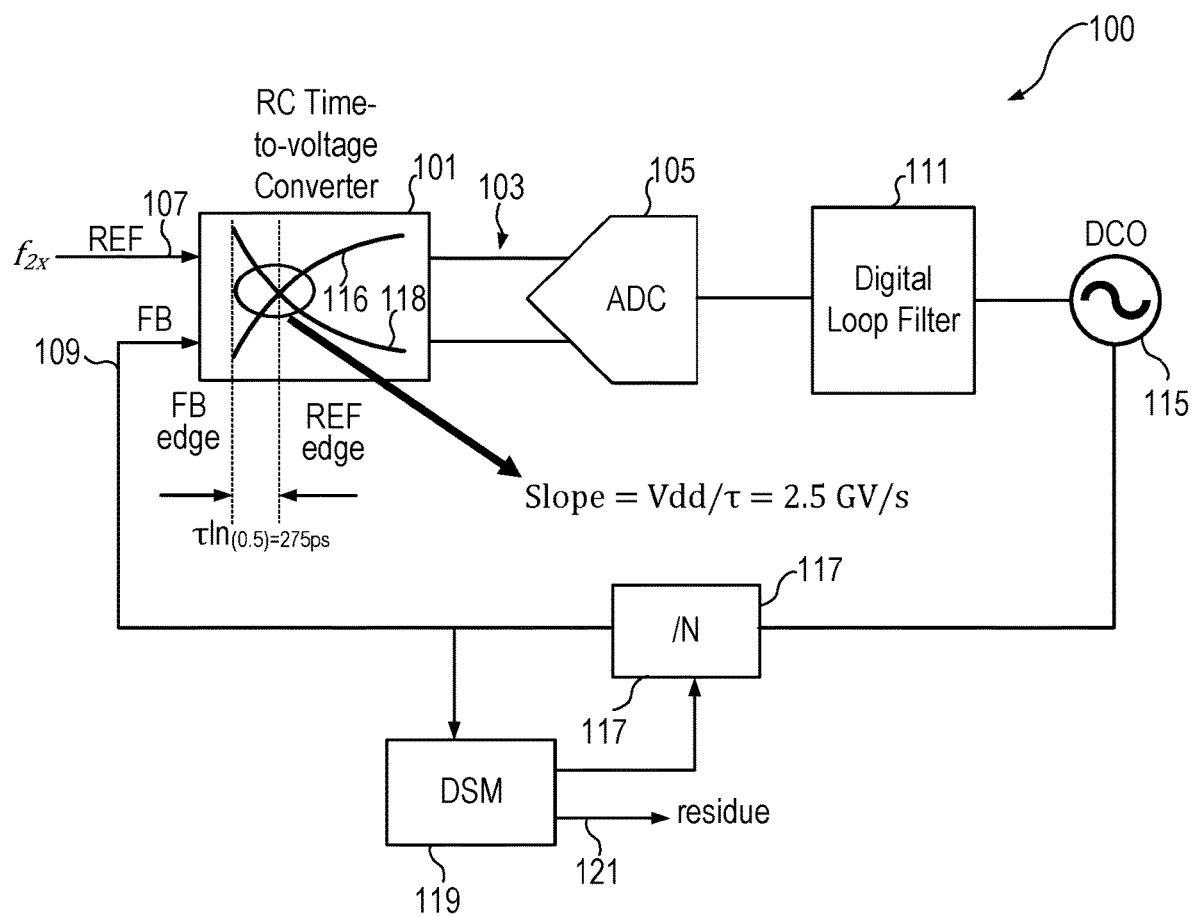
FIG. 1A illustrates a high level block diagram of an embodiment of a PLL 100 with a high gain time to voltage converter.

FIG. 1A illustrates a high level block diagram of an embodiment of a PLL 100. PLL 100 includes a high gain RC based time-to-voltage converter 101 that supplies a differential voltage 103 to an analog to digital converter (ADC) 105. The time-to-voltage converter 101 (also referred to herein as a phase detector) converts the phase difference between the reference clock signal (REF) 107 and the feedback signal (FB) 109 to the voltage 103. In simple terms, phase detection gain is considered to be high if a steep slope generator, with slopes greater than a few GV/s, is used as part of the phase detector. Conventional phase detectors do not use a slope generator and generate a current/voltage pulse whose width is proportional to the time difference of the two inputs of the phase detector. Consequently, these phase detectors have low gain, ($1/2\pi$) in typical applications. High gain is realized by the slopes generated while charging/ discharging a capacitor through a resistor. The ADC 105 supplies a digital value corresponding to the phase difference to digital loop filter 111, which in turn controls the digitally controlled oscillator (DCO) 115. The feedback divider 117 supplies the feedback clock signal 109. Delta sigma modulator (DSM) 119 controls the feedback divider 117 to achieve a fractional-N divider. Significant quantization noise, corresponding to residue 121, is associated with the DSM 119.

Figure 1B:
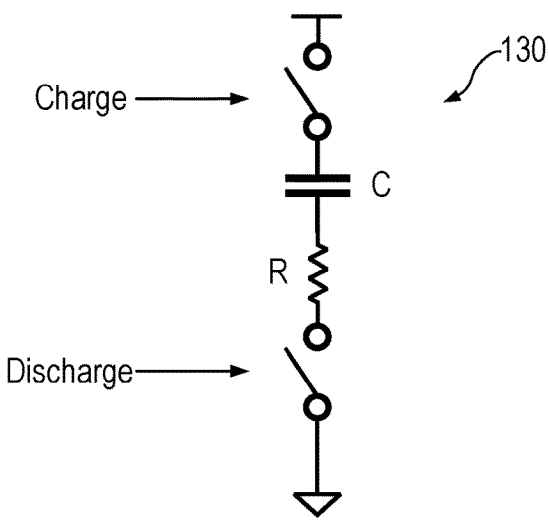
FIG. 1B illustrates a high level block diagram of an RC charging circuit of the time-to-voltage converter.

High gain sampling phase detectors such as the time-to-voltage converter 101 in FIG. 1A, have a significant non-linearity associated with them. In the presence of an additive spur at the input of the phase detector in reference clock signal 107, these non-linearities cause the mixing of quantization noise with the spur which degrades the system performance. In FIG. 1A, T is the time constant of RC charging circuit in the RC time to voltage converter. In the embodiment illustrated in FIG. 1A, $\tau \ln(0.5)=275$ ps and corresponds to the time delay after which the voltage from RC charging (rising curve 116 in time-to-voltage converter 101) equals the voltage from RC discharging curve (falling curve 118 in time-voltage converter 101). FIG. 1B illustrates an example of an RC charging circuit. The charge pulse is based on the phase difference between the REF clock signal 107 and the FB clock signal 109. The discharge pulse discharges the capacitor every measurement cycle. Additional details of an embodiment of a high gain time-to-voltage converter can be found in U.S. Pat. No. 9,762,250, entitled "Cancellation of Spurious Tones Within a Phase-Locked Loop with a Time-to-Digital Converter", naming Michael H. Perrot as inventor, issued Sep. 12, 2017, which patent is incorporated herein by reference in its entirety. Other embodiments use different approaches, e.g., current sources, to achieve the steep slope generator of a high gain phase detector. Since the PLL integrates the difference between the RC charging and RC discharging voltages to set the VCO control voltage, the loop should settle to an operating point where the RC charging voltage equals the RC discharging voltage. In other words, the loop should settle to the point of intersection of the two curves in 101. The slope of the curves at this operating point sets the gain of the phase detector and affects the noise performance as well of the PLL. As shown for the high gain phase detector of FIG. 1A, the slope=Vdd/$\tau$=2.5 GV/s.

Figure 2:
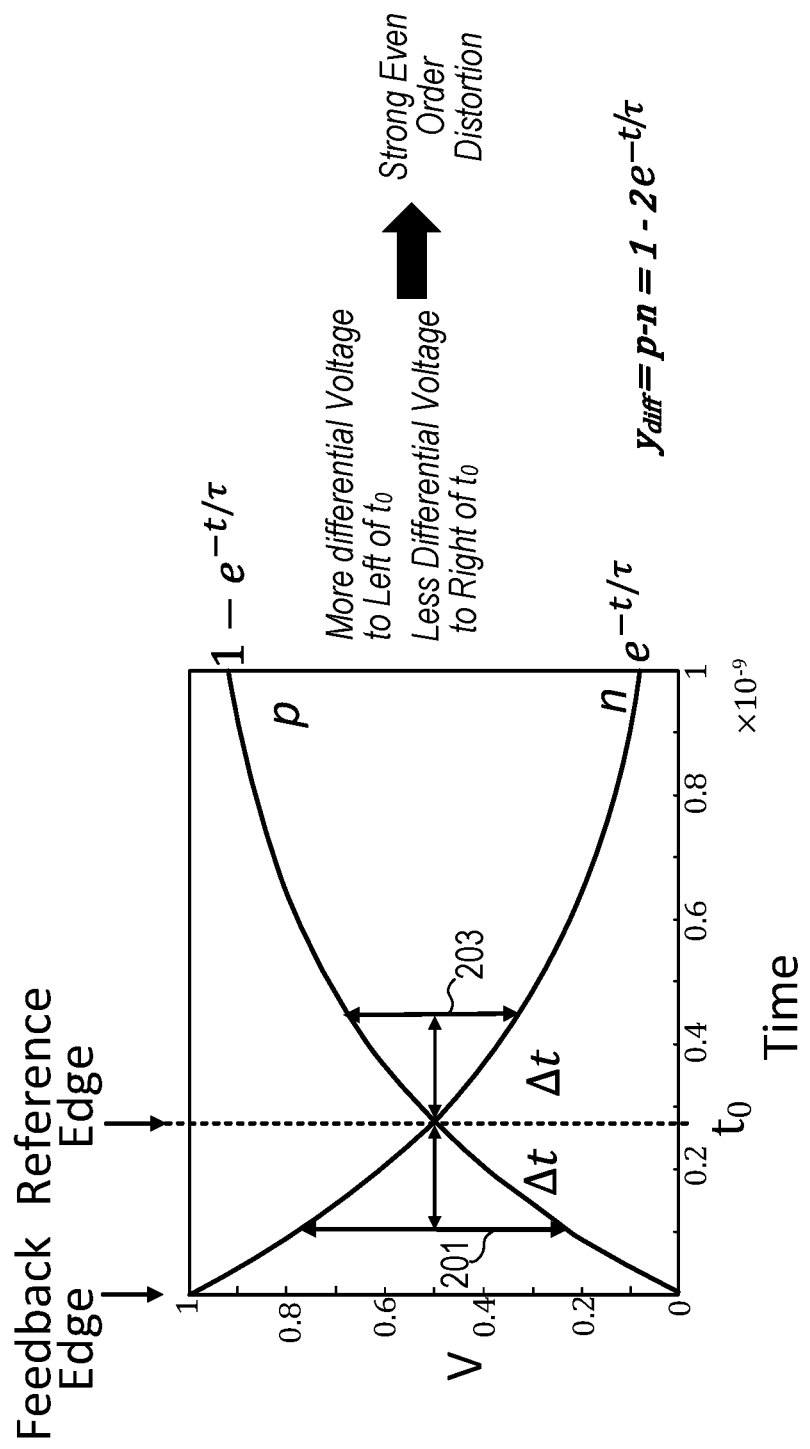
FIG. 2 illustrates non-linearity associated with a high gain time-to-voltage converter.

FIG. 2 illustrates the non-linearity associated with the high gain time-to-voltage converter 101 shown in FIG. 1A. FIG. 2 shows the positive (p) and negative (n) voltage values associated with various values of phase differences between the feedback clock signal and the reference clock signal. FIG. 2 illustrates that there is more differential voltage at 201 to represent the time difference $\Delta t$ to the left of to than the differential voltage 203 representing the time difference $\Delta t$ to the right of time to. Thus, the magnitude of the voltage is different according to whether the time difference is positive or negative. Such a difference in magnitude indicates a strong even order distortion.

Figure 3:
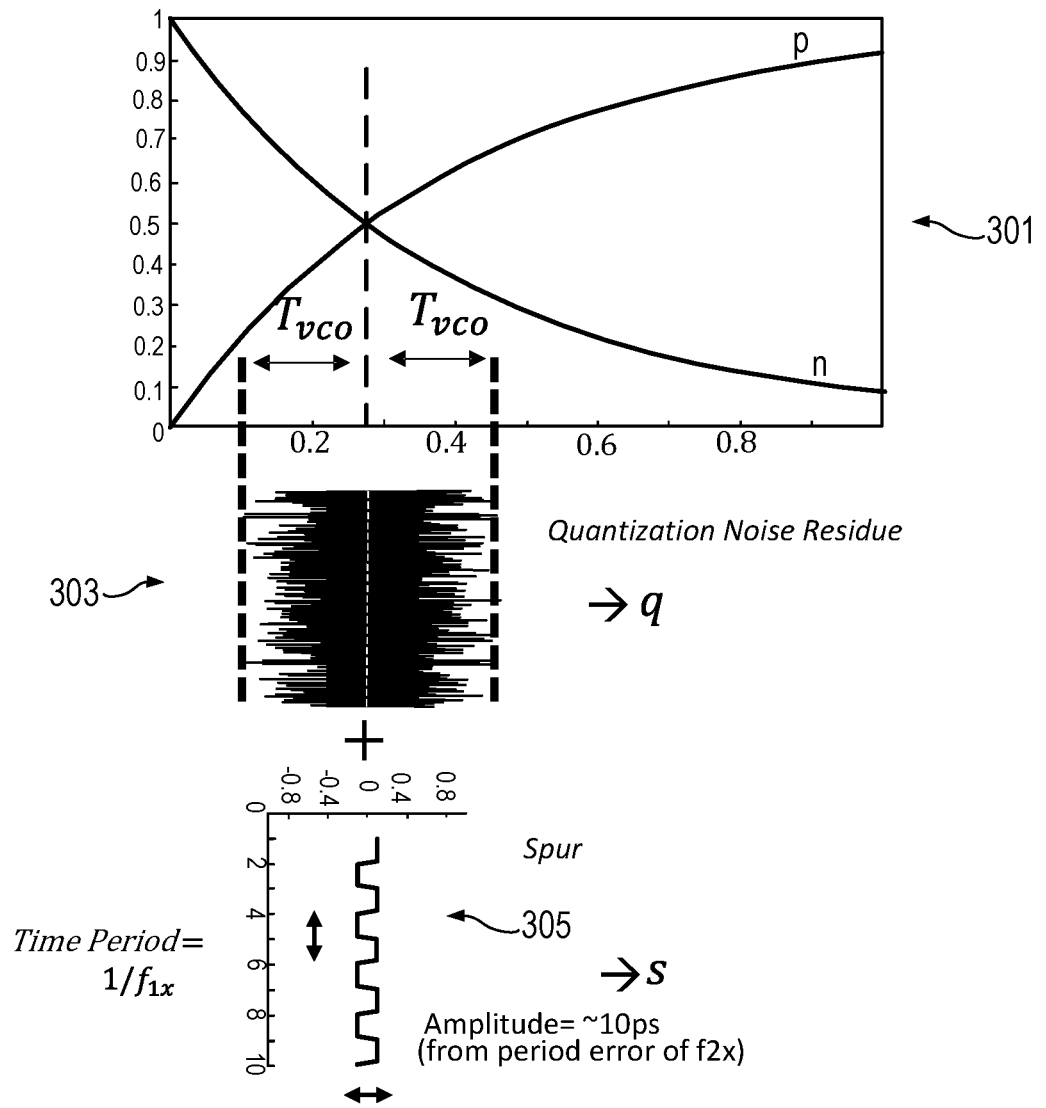
FIG. 3 illustrates two noise sources that combine in a high gain time-to-voltage converter.
Figure 4:
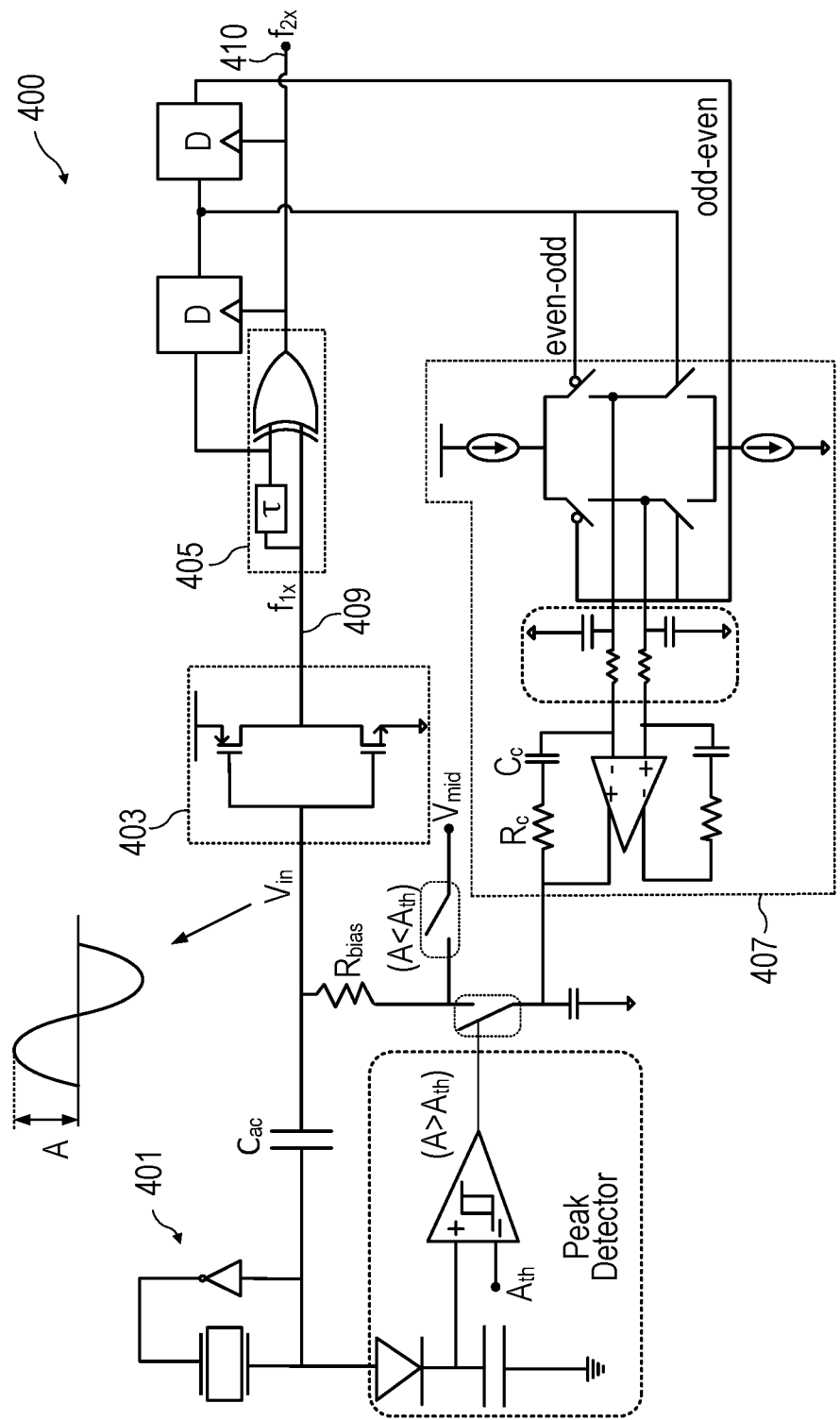
FIG. 4 illustrates a crystal oscillator and buffer circuit that generates a reference clock having a frequency that is twice the frequency of the signal supplied by the crystal oscillator.

FIG. 3 illustrates two noise sources that combine with a high gain time-to-voltage converter. The output of the time-to-voltage converter is shown in the top graph 301 for various phase difference values. The output of the time-to-voltage converter includes quantization noise (q) shown at 303. The quantization noise 303 is combined with the spur (s) shown at 305. The spur comes from a period error of the reference clock signal. In an embodiment, the reference clock signal is generated in a crystal oscillator and buffer circuit 400 such as shown in FIG. 4. The crystal oscillator 401 provides a signal that is converted to a square wave in the sine to square waver converter 403. A 2× clock multiplier 405 follows the sine to square wave converter 403. The threshold of the sine-to-square wave converter is corrected through the feedback loop that includes the duty cycle correction circuit 407. The 2X clock multiplier 405 doubles the frequency of the fix signal 409 supplied by the sine to square wave converter 403 and provides the $f_{2x}$ signal 410. The $f_{2x}$ signal 410 corresponds to the reference clock signal 107 shown in FIG. 1A. The crystal oscillator and buffer circuit 400 are described in greater detail in U.S. patent applications. Ser. No. 16/670,874, entitled "Noise Canceling Technique for a Sine to Square Wave Converter", naming Aslamali R. Rafi as first inventor, filed Oct. 31, 2019, which application is incorporated herein by reference in its entirety.

The $f_{2x}$ signal 410 contains a period error as explained further herein. Such a period error would be readily canceled by a linear phase detector. However, with a non-linear phase detector such as shown in FIG. 1A, the period error results in a spur on the output of the PLL if the spur is not otherwise addressed. FIG. 5A illustrates that a DC time error 501 supplied to a type II PLL results in the feedback pulse moving to the right as shown at 503. However, as shown in FIG. 5B, the duty cycle error on even and odd pulses shown at 521, 523, 525 in the $f_{2x}$ clock signal results in a discrete time square wave ($\pm t_{err}/2$) error term to appear at the phase detector input. As shown at 527 the period error results in the time error alternating between ($t_{err}/2$) and ($-t_{err}/2$).

Figure 6A:
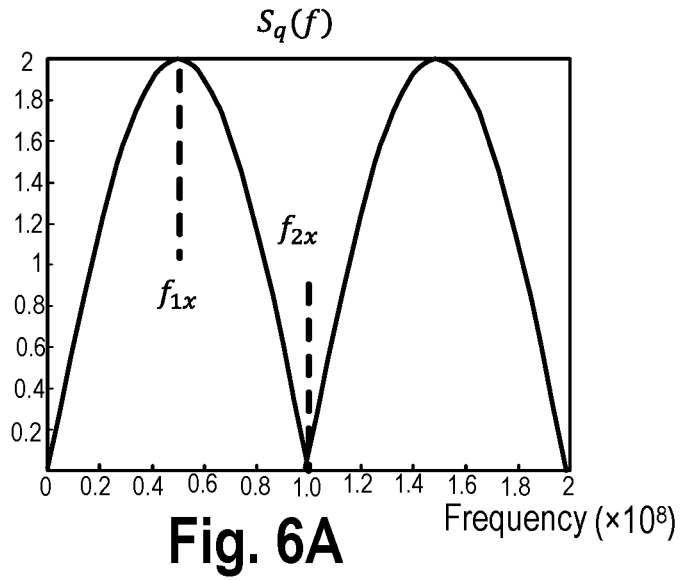
FIG. 6A illustrates the quantization noise power spectral density.
Figure 6B:
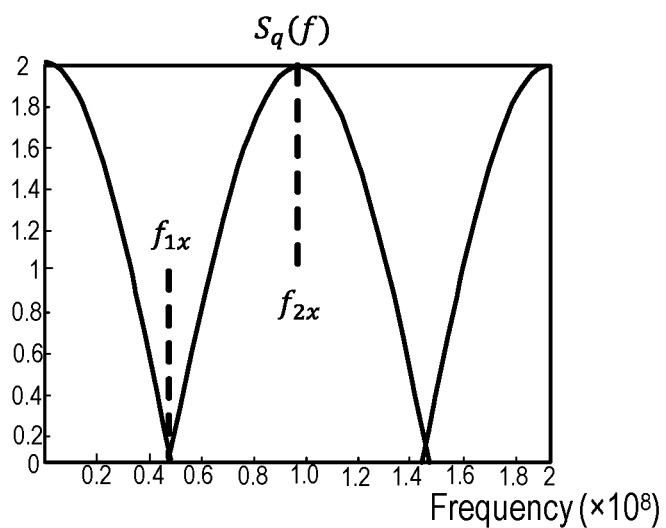
FIG. 6B illustrates the power spectral density in the presence of second order non-linearity in the time to voltage converter and a period error in the reference clock signal.

FIG. 6A illustrates the quantization noise power spectral density absent the presence of second order non linearity. As can be seen, the noise at the $f_{2x}$ frequency is near zero. However, in the presence of second order non-linearity in the time to voltage converter, the quantization noise q and the spur s from the period error combine as $(q+s)^2=q^2+s^2+2qs$. FIG. 6B shows that the presence of second order non-linearity results in an extra term with the quantization noise being frequency translated to the frequency $f_{2x}$.

Figure 7:
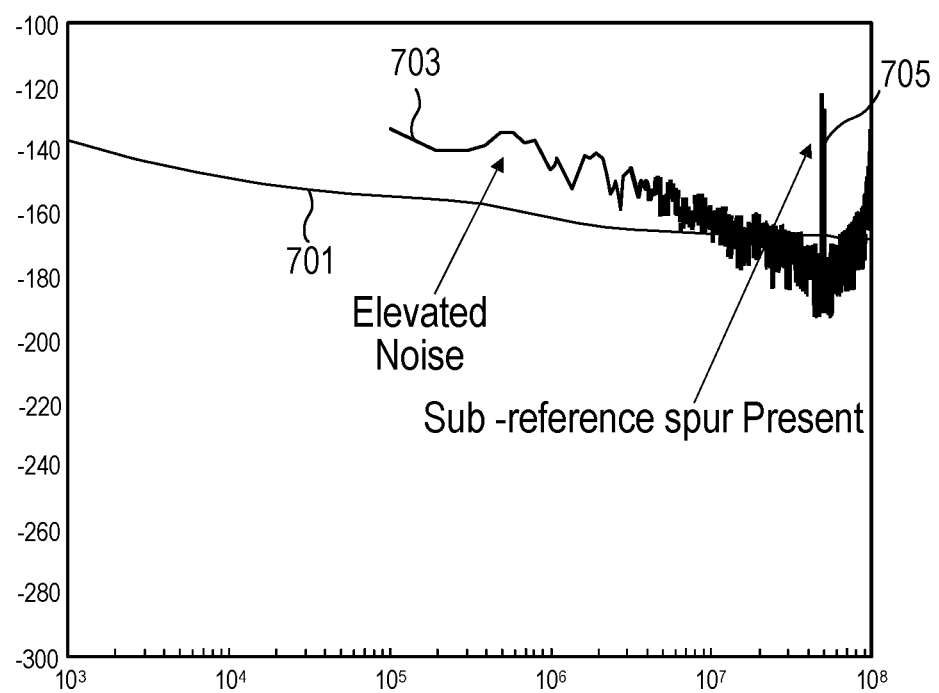
FIG. 7 illustrates how the frequency translated quantization noise affects PLL performance.

The frequency translated quantization noise negatively affects the PLLs performance. Referring to FIG. 7, line 701 shows the level of acceptable noise PLL performance in an embodiment and line 703 shows the elevated noise and sub-reference spur 705 resulting in degraded phase noise performance when a spur mixes with quantization noise in the phase detector.

Embodiments described herein enable high-gain low-noise phase detection even in the presence of a spur at the reference clock signal input allowing realization of high performance ultra-low jitter PLLs that achieve performance comparable to that of a high Q bulk acoustic wave (BAW) based resonator used as a voltage controlled oscillator (VCO) while using a conventional LC oscillator as the VCO using digital techniques.

Figure 8:
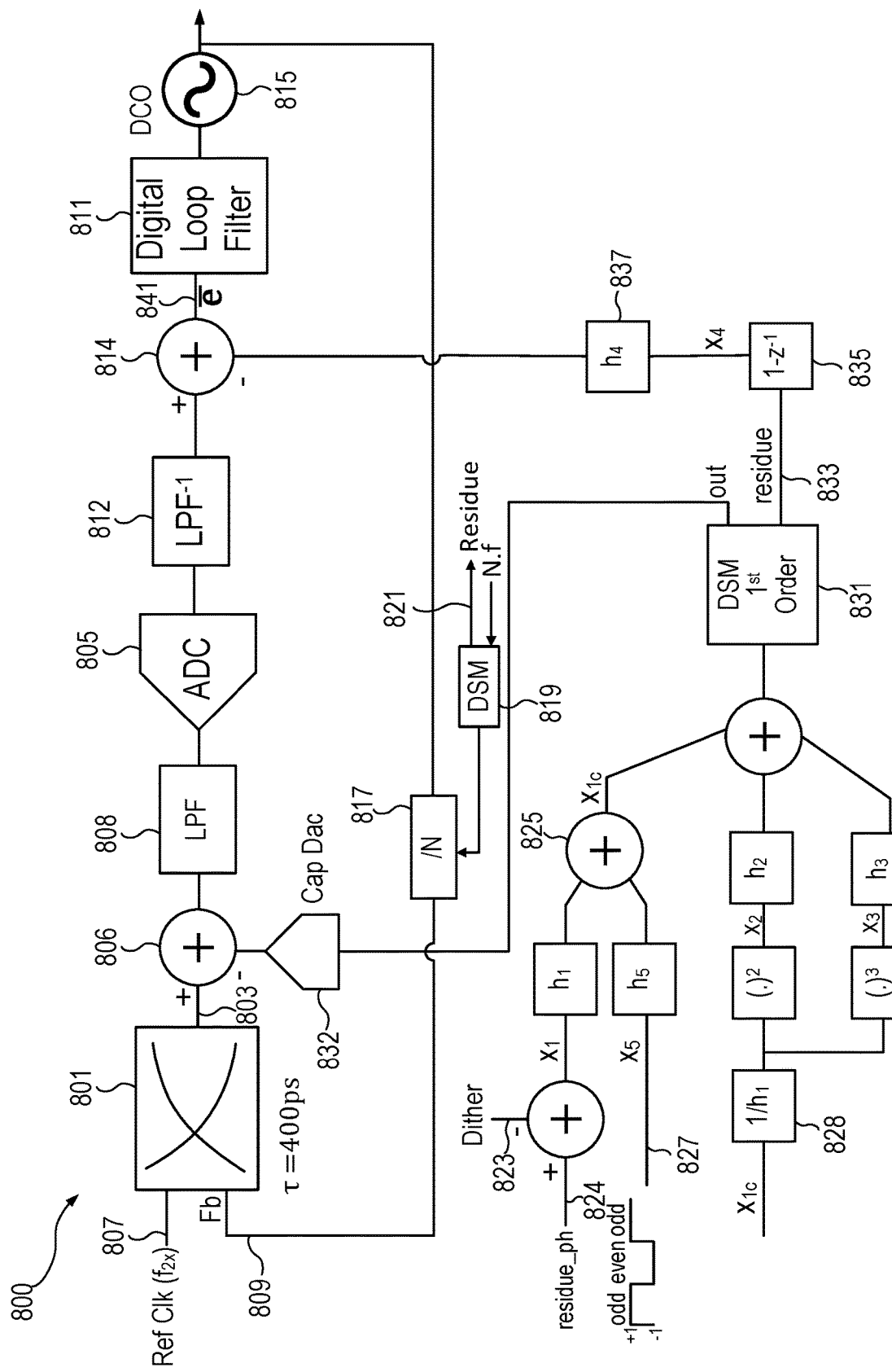
FIG. 8 illustrates an embodiment that addresses the frequency-translated quantization noise caused by a spur (a duty cycle error) present in the reference clock signal.

FIG. 8 illustrates an embodiment that addresses the frequency-translated quantization noise caused by an additive spur in the reference clock signal. PLL 800 includes an RC time-to-voltage converter 801 that supplies a voltage 803 to an analog to digital converter (ADC) 805 through summer 806 and low pass filter 808. The time to voltage converter 801 includes a phase and frequency detector (PFD) and RC charging circuit (not shown separately in FIG. 8). The voltage 803 is an analog error signal representing the phase difference between reference clock (REF) 807 and the feedback clock (FB) 809. The low pass filter (LPF) 808 is a consequence of transferring the sampled voltage of RC phase detector into the ADC input. That is accomplished as charge transfer from the sampling capacitor of RC phase detector 801 (also referred to herein as a time-to-voltage converter) into an integrating capacitor at the input of ADC 805. That charge transfer results in a discrete time low pass filter, whose effect is cancelled out in the digital domain by the action of the inverse filter 812. The ADC 805 supplies a digital error signal corresponding to the phase difference to the inverse low pass filter 812. Summing circuit 806 receives a cancellation signal from a capacitor digital to analog converter (DAC) 823, to add or subtract a cancellation voltage to cancel the quantization noise (including the frequency translated quantization noise) and the spur. An embodiment of a capacitor DAC is described in U.S. Pat. No. 9,762,250, entitled "Cancellation of Spurious Tones Within a Phase-Locked Loop with a Time-to-Digital Converter", naming Michael H. Perrot as inventor, issued Sep. 12, 2017. In other embodiments, a different type of DAC is used to add or subtract charge to cancel the quantization noise. A second summing circuit 814 adjusts the error signal 841 being supplied to digital loop filter 811 based on the residue from delta sigma modulator 831 as explained further herein. The digital loop filter 811 controls the DCO 815 to adjust the output of the DCO to match the reference clock signal. The PLL 800 includes a fractional N feedback divider including a multi-modulus feedback divider 817 under control of delta sigma modulator 819. DSM 819 receives a fractional divide value N.f and controls the multi-modulus feedback divider 817. Significant quantization noise is associated with the DSM 819.

In an embedment the delta sigma modulator 819 is a conventional second order DSM and provides a residue sequence 821 that corresponds to the delta sigma quantization noise to be cancelled. A dither sequence (not shown in FIG. 8) is used by the delta sigma modulator to improve scrambling of the quantization noise. In an embodiment, the dither sequence is removed from the residue signal before determining a cancellation polynomial representing the noise to be canceled.

The accumulated dither signal 823 is subtracted from the integrated residue signal 824 (residue_ph) in summer 825 and the subtraction result $x_1$ is supplied to the coefficient block $h_1$. The residue 821 of the delta sigma modulator is a "frequency" residue. That is because the output of the delta sigma modulator controls the instantaneous division value of feedback divider or in other words the frequency of the divided down signal. However, at the phase detector input, the phase is determined by the sum of all the previous feedback divider values. That inherent integration implies that if the quantization noise is canceled at the phase detector output, "phase" residue should be used instead of "frequency" residue. Thus, the frequency residue is integrated to provide the phase residue (residue_ph). Note that the summers shown in FIG. 8 and the other figures herein may be additive or subtractive. The spur 827 in the form of a scaled square wave is supplied to a coefficient block $h_5$ and $h_5x_5$ is added to the result $h_1x_1$ in summer 825. The output $x_{1c}$ of the summer 825 is combined with other terms to form a polynomial, which corresponds to the noise to be canceled and a cancellation value based on the polynomial is supplied to delta sigma modulator 831. The output of the delta sigma modulator 831 is used to control the capacitor DAC 832, which adds or subtracts voltage from the analog error signal (phase difference between REF clock 807 and FB clock 809) to cancel both the spur and quantization noise, including frequency translated components thereof.

Note that the embodiment of FIG. 8 is trying to replicate what happens in the analog phase detector through digital signal processing. The non-linearity of the time-to-voltage converter resulting in the frequency translation is mimicked digitally through the "square" term $x_2$ and the "cube" term $x_3$ of the polynomial. The linear term $x_{1c}$ addresses non-frequency translated quantization and spur error. The output $x_{1c}$ of summer 825 is supplied to divider block 828, which divides $x_{1c}$ by the coefficient h1. Thus, $x_1c/h_1$ is squared and cubed and multiplied by coefficients $h_2$ and $h_3$ to form the square and cube terms respectively of the polynomial. Thus, frequency translated quantization noise appears in $x_2$ and $x_3$. Frequency translated quantization noise as well as non frequency translated quantization noise are accounted for in the polynomial supplied to the delta sigma modulator 831.

One reason for utilizing the delta sigma modulator 831 is to achieve a reasonable number, e.g., 4-6 bits for the capacitor DAC to make the capacitor DAC implementation practical. However, use of the delta sigma modulator 831 results in residual quantization noise error that also needs to be corrected. The error of the capacitor DAC cancellation can be estimated from the residue 833 of the delta sigma modulator 831 using a first order difference in block 835 and an appropriate scaling factor $h_4$. The residue error is subtracted from the digital error signal (phase difference) in summer 814 before being supplied to digital loop filter 811. For ease of illustration, the high level digital signal processing block diagram shown in FIG. 8 omits delay blocks that may be required to properly align signals.

Figures 9, 10:
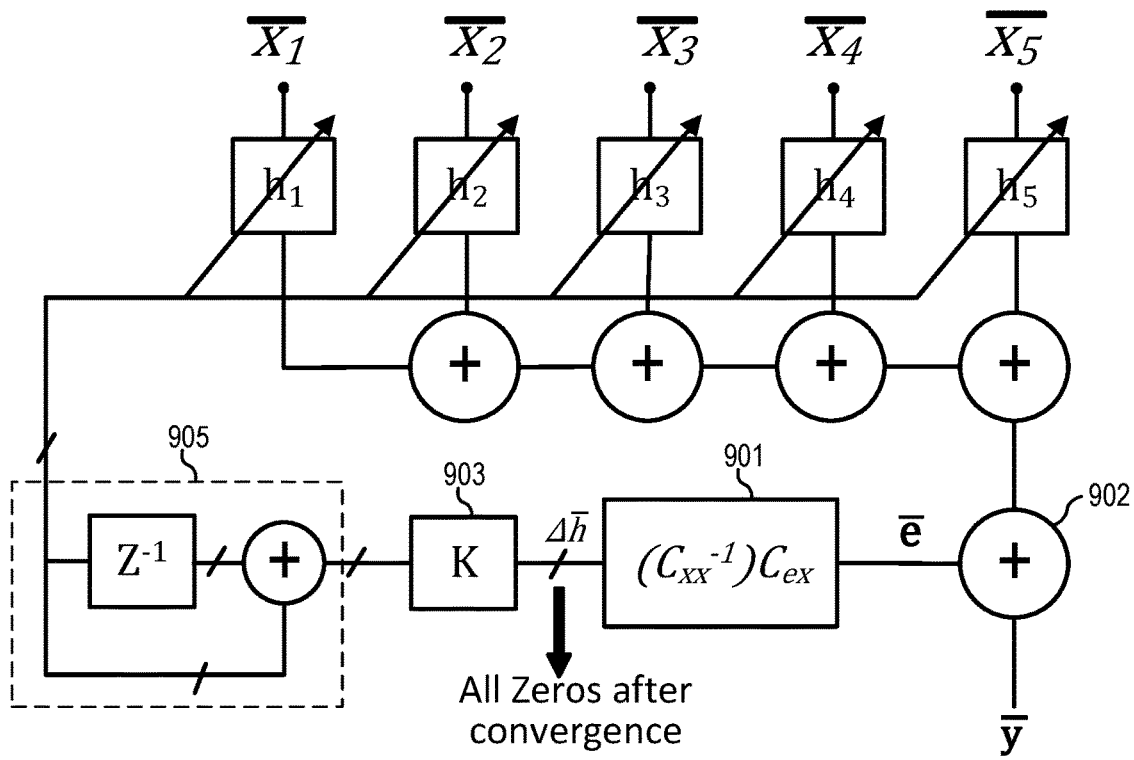
FIG. 9 illustrates the adaptation loop used to update the coefficients $h_1$-$h_5$ of the polynomial used to cancel the quantization noise and frequency translated quantization noise.
FIG. 10 illustrates the use of the Gauss Seidel Method in the adaptation loop.

The parameters of the analog time-to-voltage converter are a function of semiconductor process and temperature, whereas, digital signal processing is not. Therefore, an adaptive algorithm is used to find the coefficients, $h_1$-$h_5$, so that the digital estimate of the gain and non-linearity of the time-to-voltage converter is as close to the analog gain and non-linearity as permissible. FIG. 9 illustrates an embodiment of an adaptation loop used to update the coefficients $h_1$-$h_5$. $C_{xx}$ is the covariance matrix of the signals $x_1$, $x_2$, $x_3$, $x_4$ and $x_5$ (shown in FIG. 8) and $C_{ex}$ is cross-correlation vector of the error $\bar{e}$ with $x_1$-$x_5$, where the error e is shown at 841 in FIG. 8. The product of the inverse of $C_{xx}$ and $C_{ex}$ generated in 901 provides an estimate $\Delta h$ of the deviation of the weights $\bar{h}$ from the optimum solution $$(\overline{h_{opt}}),$$

and thus $$\Delta \bar{h} = (\bar{h} - \overline{h_{opt}}).$$

With analog cancellation, the non linear phase error $\bar{y}$ is not available for determining the cross correlation matrix $C_{ex}$. Instead, $\bar{y}$ is distributed and is present as input to the summers 806 and 814 in FIG. 8. So, in FIG. 9 the summer 902 whose input is $\bar{y}$ is actually distributed in two places in the embodiment of FIG. 8: namely, 806 and 814. The non linear phase error $\bar{y}$ is a linear combination of $x_1$, $x_2$, $x_3$, $x_4$, and $x_5$, where $$\bar{y} = \alpha\overline{x_1} + \beta\overline{x_2} + \gamma\overline{x_3} + \delta\overline{x_4} + \varepsilon\overline{x_5}.$$

Instead of $\bar{y}$, the error $\bar{e}$ is used to determine the deviations of $\bar{h}$ from $$(\overline{h_{opt}}).$$

The error $$\bar{e} = (h_1 - \alpha)\overline{x_1} + (h_2 - \beta)\overline{x_2} + (h_3 - \gamma)\overline{x_3} + (h_4 - \delta)\overline{x_4} + (h_5 - \varepsilon)\overline{x_5},$$

is minimized when $$\bar{h} = (\overline{h_{opt}}),$$

where $$\overline{h_{opt}}$$

is a vector whose elements are $\alpha$, $\beta$, $\gamma$, $\delta$ and $\in$. The deviation of $\bar{h}$ from $$\overline{h_{opt}}$$

is estimated by the product of the inverse of $C_{xx}$ and $C_{ex}$ generated in box 901. The adaptation loop acts upon this deviation of $\bar{h}$, from $$\overline{h_{opt}}$$

and drives this deviation to zero. That is accomplished by integrating this deviation through the accumulators 905 in FIG. 9 and letting the accumulator outputs control the h weights. The gain term K in the adaptation loop is used to trade-off noise and bandwidth of the adaptation loop. The output of the accumulators will converge to the desired coefficient values $h_1$-$h_5$ leading to zero correlation between $x_1$-$x_5$ and the error signal $\bar{e}$. Thus, the convergence results in the product of $C_{xx}^{-1}$ and $C_{ex}$ going to zero. The accumulated values in accumulator 905 will then maintain the correct $h_1$-$h_5$ values to effectively cancel the noise terms including the frequency translated noise. With environmental changes such as changes in voltage or temperature, non-zero correlation will again occur and the coefficient values $h_1$-$h_5$ will be adjusted by the adaptation loop until zero correlation returns.

In an embodiment, the product of the inverse of the covariance matrix ($C_{xx}^{-1}$) with $C_{ex}$ is found iteratively through use of the Gauss Seidel algorithm. FIG. 10 illustrates solving for ($\Delta\bar{h}$), which is the deviation of $\bar{h}$ from $$\overline{h_{opt}}.$$

The weights ($\overline{\Delta h}$) are determined by $C_{xx}^{-1}C_{ex}$ and the matrix inversion is carried out iteratively using the Gauss Seidel Method. The steps include (1) scale $C_{xx}$ and $C_{ex}$ such that $C_{xx}$ has unity diagonal; (2) split $C_{xx}$ into a unity diagonal I, a lower matrix L, and an upper matrix U as shown in FIG. 10, and (3) iterate on equation 1001. Other embodiments use an alternative algorithm to do matrix inversion, e.g., Jacobi or Gauss Elimination.

Figure 11:
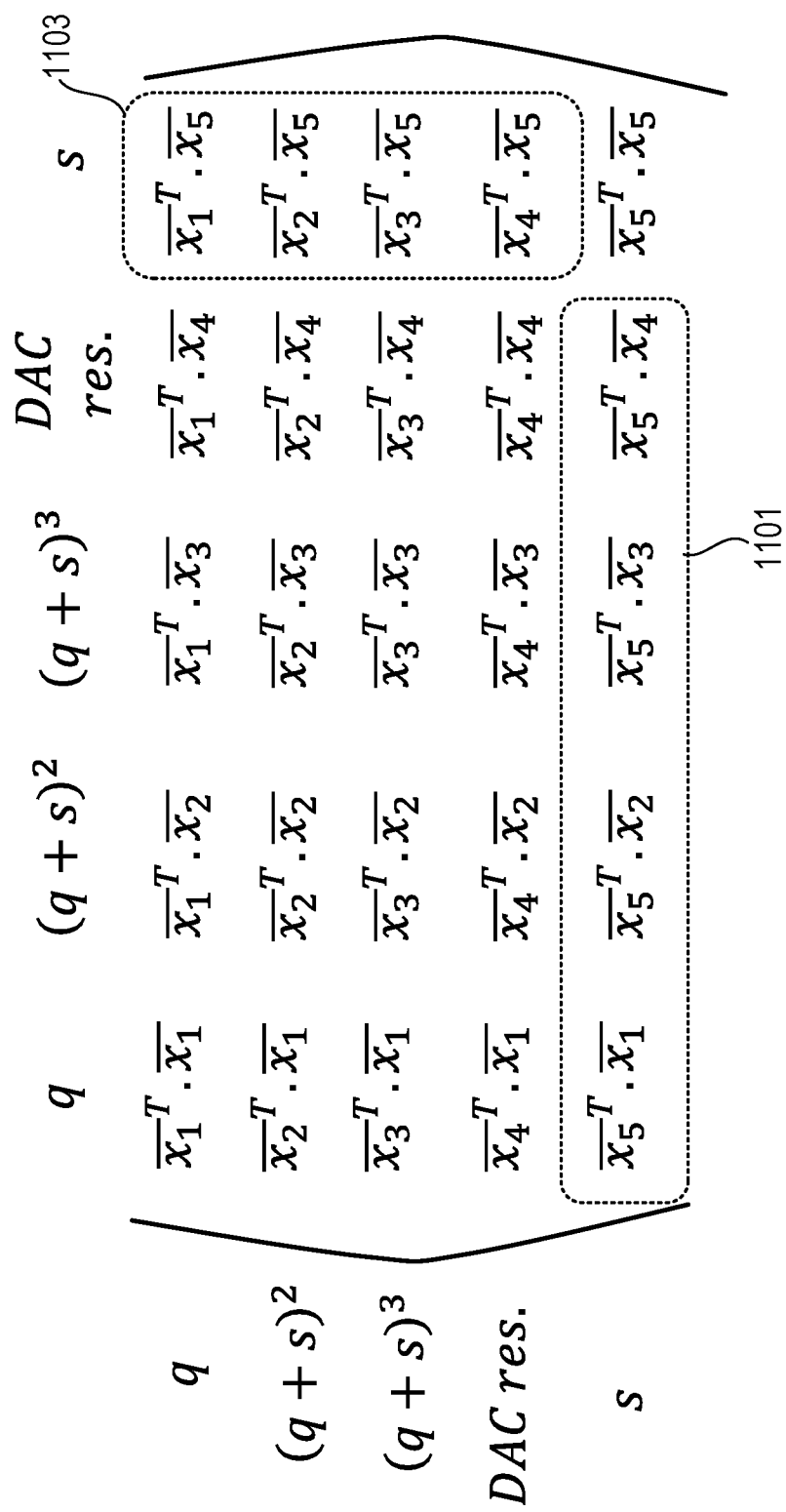
FIG. 11 illustrates the covariance matrix $C_{ex}$ used in the adaptation loop.

FIG. 11 illustrates the cross correlation matrix $C_{ex}$. Note that since the spur signal s is a square wave, computations shown at 1101 and 1103 involve only shifting and adding and not multiplication, simplifying possible implementations.

Figure 12:
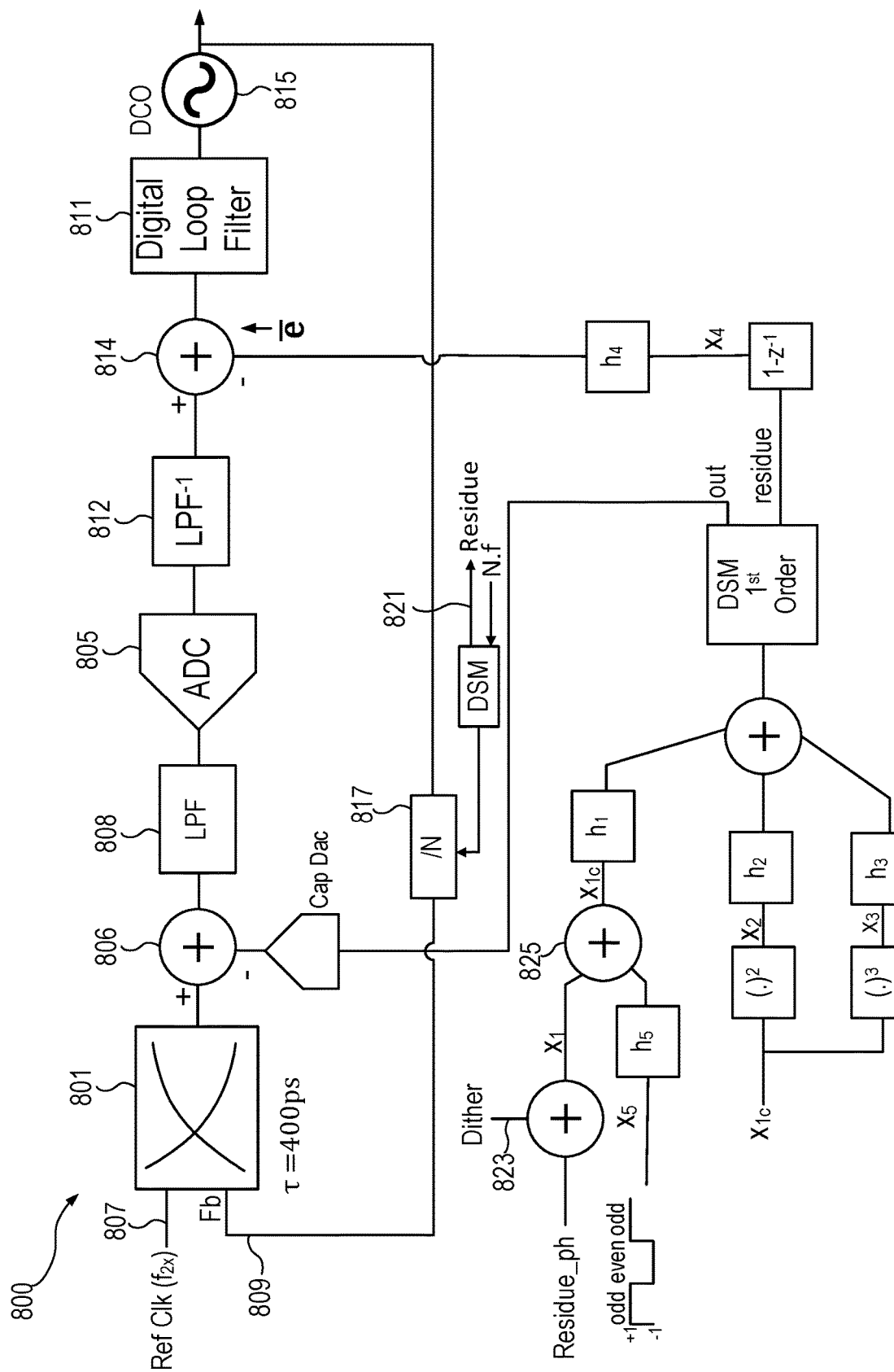
FIG. 12 illustrates an alternative embodiment to generate a cancellation signal that cancels the quantization noise and frequency translated quantization noise.

FIG. 12 illustrates an alternative implementation to generate a control signal for the capacitor DAC that accounts for frequency translated quantization noise as well as non frequency translated quantization noise in the polynomial supplied to the delta sigma modulator 831. In the embodiment of FIG. 12, the coefficient block $h_1$ moves to the right side of summer 825 as compared to FIG. 8. The summer 825 in FIG. 12 sums the signal $x_1$ (residue less dither) and the spur signal ($x_5$) multiplied by $h_5$ to scale the spur square wave to generate the summer 825 output $x_{1c}$. The square term $x_2$ and the cube term $x_3$ are formed by squaring and cubing the summer output $x_{1c}$. Note that the implementation shown in FIG. 12 eliminates the need for the ($1/h_1$) block 828 used in the implementation shown in FIG. 8. Note that h5 converges to different values in the embodiments of FIGS. 8 and 12. That is expected because the gain from h5 to the cancellation point is also different in the two solutions. The value of converged h5 in one case will be h1 times the converged value of h5 in the other.

Figure 13:
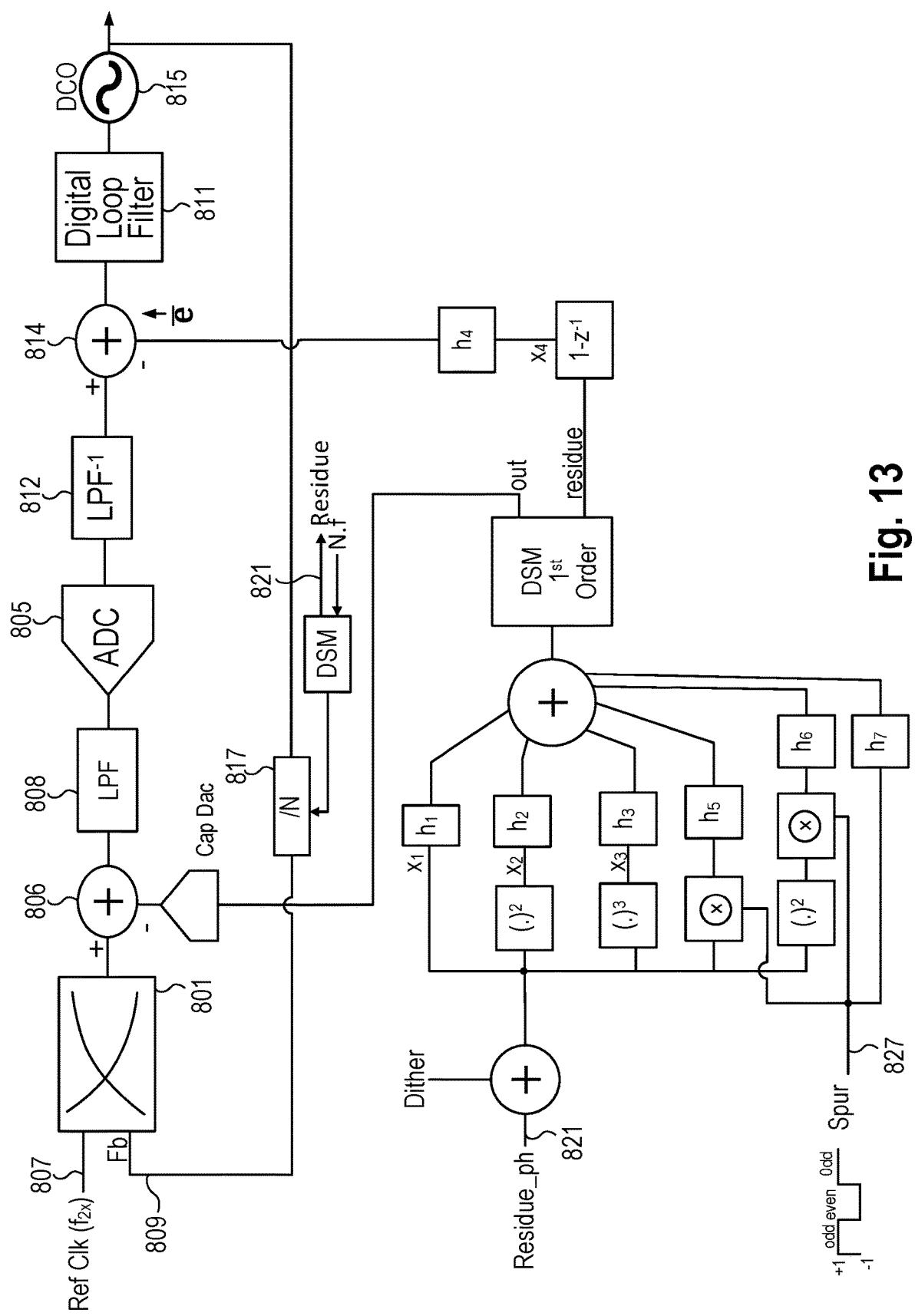
FIG. 13 illustrates another alternative embodiment to generate a cancellation signal that cancels the quantization noise and frequency translated quantization noise.

Another embodiment shown in FIG. 13 combines the quantization error (the residue signal 821) and the spur 827 to generate a polynomial for use in generating the cancellation signal. Note that the polynomial generated in FIG. 13 includes additional coefficients ($h_1$-$h_7$) as compared to the embodiment of FIG. 8, which has four ($h_1$-$h_4$) instead of seven coefficients. That results in the covariance matrix increasing from a 5×5 to a 7×7 requiring additional operations. In the embodiment of FIG. 13, frequency translated versions of q, $q^2$ and $q^3$ are generated and adaptively cancelled through coefficients $h_5$, $h_6$ and $h_7$. Coefficients $h_1$, $h_2$ and $h_3$ are used to adaptively cancel the non frequency translated quantization noise q, $q^2$, and $q^3$. For applications that have power and/or space considerations, the solutions described in FIGS. 8 and 12 provide advantages as compared to the solution in FIG. 13.

Figure 14:
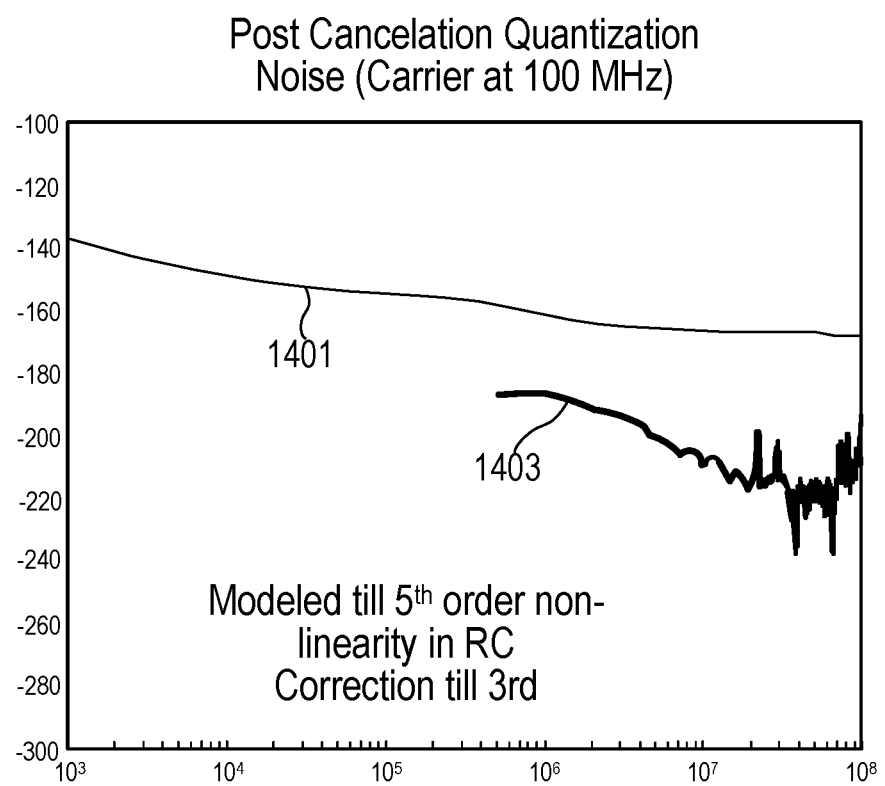
FIG. 14 illustrates how the cancellation affects PLL performance by reducing quantization noise.

Referring to FIG. 14, showing results of modeling of the cancellation approaches described herein. The model assumes non-linearity up to $5^{th}$ order in the RC time to voltage converter and correction until $3^{rd}$ order. Curve 1401 represents the level of acceptable PLL performance, and after cancellation the frequency translated quantization noise is suppressed to levels indicated by 1403, which are quite low when compared to the acceptable mask of phase noise. As compared to FIG. 7, the noise cancellation can be seen to be successful at lowering elevated noise resulting from the spur on the reference clock input signal and a high gain time to voltage converter.

Thus, various aspects of a high resolution low noise PLL that effectively cancels quantization noise and frequency translated quantization noise have been described. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method of operating a phase-locked loop (PLL) comprising:
   generating a polynomial indicative of noise to be canceled, the noise including quantization noise and frequency translated quantization noise, the quantization noise associated with a first delta sigma modulator controlling a feedback divider in the PLL;
   wherein generating the polynomial includes combining a signal indicative of a spur and a residue term indicative of the quantization noise, the spur being present in a reference clock signal being supplied to a phase and frequency detector of the PLL; and
   cancelling the quantization noise and the frequency translated quantization noise in an analog error signal in the PLL based on the polynomial.

2. The method as recited in claim 1 further comprising:
   supplying a cancellation value corresponding to the polynomial to a second delta sigma modulator;
   generating a cancellation control signal in the second delta sigma modulator based on the cancellation value; and
   controlling a digital to analog converter with the cancellation control signal to add or subtract a cancellation voltage to or from the analog error signal to thereby cancel the quantization noise and the frequency translated quantization noise, the analog error signal indicative of a phase difference between a feedback signal from the feedback divider and the reference clock signal.

3. The method as recited in claim 2 further comprising:
   taking a first order difference of a second residue from the second delta sigma modulator, the second residue corresponding to second quantization noise;
   multiplying the first order difference by a scale factor as part of generating a second cancellation signal; and
   cancelling error caused by the second quantization noise.

4. The method, as recited in claim 1, further comprising:
   supplying a square wave as the signal indicative of the spur;
   forming a linear term, a square term, and a cube term of the polynomial, the linear term, the square term, and the cube term incorporating a spur term that is the signal indicative of the spur;
   updating coefficients of the linear term, the square term, and the cube term adaptively; and
   determining a cancellation value based on the polynomial.

5. The method, as recited in claim 4, wherein the square wave is a ±1 square wave corresponding to a period error of the reference clock signal.

6. The method as recited in claim 4 wherein forming the polynomial further comprises:
   subtracting a dither term from the residue term to form a first result;
   multiplying the first result by a first coefficient and generating a first multiplication result;
   multiplying the spur term by a another coefficient and generating a second multiplication result;
   summing the first multiplication result and the second multiplication result and forming the linear term of the polynomial;
   supplying the linear term to a summing circuit;
   dividing the linear term by the first coefficient to generate a division result, squaring the division result to generate a squared division result, and multiplying the squared division result by a second coefficient to generate the square term of the polynomial;
   supplying the square term to the summing circuit;
   cubing the division result to generate cubed division result, and multiplying the cubed division result by a third coefficient to generate the cube term of the polynomial; and
   supplying the cube term to the summing circuit.

7. The method as recited in claim 4 wherein forming the polynomial further comprises:
   subtracting a dither term from the residue term to form a first result ;
   multiplying the spur term by a fifth coefficient and generating a first multiplication result;
   summing the first multiplication result and the first result to form a first sum;
   multiplying the first sum by a first coefficient to form the linear term of the polynomial;
   supplying the linear term to a summing circuit;
   squaring the first sum to generate a first squared term, and multiplying the first squared term by a second coefficient to generate the square term of the polynomial;
   supplying the square term to the summing circuit;
   cubing the first sum to generate a first cubed term, and multiplying the first cube term by a third coefficient to generate the cube term of the polynomial; and
   supplying the cube term to the summing circuit.

8. A method of operating a phase-locked loop (PLL) comprising:
   generating a polynomial for use in canceling quantization noise present in a PLL analog error signal indicative of a phase difference between a reference clock signal and a feedback signal, the quantization noise associated with a delta sigma modulator controlling a feedback divider in the PLL that supplies the feedback signal, and the polynomial for use in canceling frequency translated quantization noise present, in part, due to a spur in the reference clock signal that is being supplied to an input of a phase and frequency detector of the PLL; and
   canceling the quantization noise and frequency translated quantization noise based on the polynomial that is generated.

9. The method as recited in claim 8 wherein the frequency translated quantization noise is caused, at least in part, by second order non-linearity associated with generating the PLL analog error signal.

10. The method as recited in claim 8 further comprising:
    supplying a cancellation value corresponding to the polynomial to a second delta sigma modulator;
    the second delta sigma modulator generating a cancellation control signal based on the cancellation value; and
    controlling a digital to analog converter (DAC) with the cancellation control signal to generate a cancellation voltage; and
    adding or subtracting the cancellation voltage from the PLL analog error signal.

11. The method as recited in claim 8 further comprising:
    generating the polynomial using a spur signal representative of the spur in the reference clock signal, a residue signal associated with a residue of the delta sigma modulator, and adaptive coefficients of the polynomial.

12. A phase-locked loop (PLL) comprising:
an oscillator;
a time-to-voltage converter including a phase and frequency detector (PFD) coupled to receive a feedback signal and a reference clock signal, the-time-to-voltage converter configured to supply an analog error signal indicative of a phase difference between the reference clock signal and the feedback signal;
a feedback divider coupled to an output of the oscillator and configured to supply the feedback signal;
a spur cancellation circuit configured to receive a dither signal, a residue signal indicative of quantization noise associated with a first delta sigma modulator controlling the feedback divider and to receive a spur signal indicative of a spur that is present in the reference clock signal; and
wherein the spur cancellation circuit is configured to generate a cancellation polynomial indicative of noise to be canceled, the noise to be canceled including quantization noise and frequency translated quantization noise.

13. The PLL as recited in claim 12 wherein the frequency translated quantization noise is caused, at least in part, by second order non-linearity associated with the time-to-voltage converter.

14. The PLL as recited in claim 12 further comprising:
a digital to analog converter (DAC) coupled to the analog error signal supplied by the time-to-voltage converter;
a second delta sigma modulator coupled to receive a cancellation value based on the cancellation polynomial and to supply a control signal to the DAC; and
wherein the DAC is responsive to the control signal to add or subtract a cancellation voltage from the analog error signal.

15. The PLL as recited in claim 14 further comprising:
a first order difference circuit to generate a first order difference of a second residue from the second delta sigma modulator, the second residue corresponding to second quantization noise; and
a multiplier circuit to multiply the first order difference by a scale factor to generate a second cancellation signal to cancel error in a signal that represents the phase difference that is caused by the second quantization noise.

16. The PLL as recited in claim 12 wherein the spur signal is a square wave signal.

17. The PLL as recited in claim 16 wherein the spur cancellation circuit is configured to generate a linear term, a square term, and a cube term of the cancellation polynomial, the linear term, the square term, and the cube term incorporating the square wave signal.

18. The PLL as recited in claim 17 wherein respective coefficients associated with the linear term, the square term, and the cube term are updated adaptively.

19. The PLL as recited in claim 17 wherein the spur cancellation circuit further comprises:
a first summing circuit coupled to subtract a dither signal from the residue signal to form a first result;
a first multiplier circuit to multiply the first result by a first coefficient and generate a first multiplication result;
a second multiplier circuit to multiply the spur signal by another coefficient and generate a second multiplication result;
a second summing circuit to sum the first multiplication result and the second multiplication result and form a linear term of the cancellation polynomial;
a third summing circuit coupled to the second summing circuit to receive the linear term;
a divide circuit to divide the linear term by the first coefficient to generate a division result;
a square circuit to square the division result to generate a squared division result;
a third multiplier circuit to multiply the squared division result by a second coefficient to generate the square term of the cancellation polynomial and supply the square term to the third summing circuit;
a cube circuit to cube the division result to generate a cubed division result; and
a third multiplier circuit to multiply the cubed division result by a third coefficient to generate the cube term of the cancellation polynomial and supply the cube term to the third summing circuit.

20. The PLL as recited in claim 12 wherein the spur cancellation circuit further comprises:
a first summing circuit coupled to subtract a dither term from the residue signal to form a first result;
a first multiplier circuit to multiply the spur signal by a fifth coefficient and generating a first multiplication result;
a second summing circuit to sum the first multiplication result and the first result to form a first sum;
a second multiplier to multiply the first sum by a first coefficient to form a linear term of the cancellation polynomial;
a third summing circuit coupled to receive the linear term;
a squaring circuit to square the first sum to generate a first squared term;
a third multiplier to multiply the first squared term by a second coefficient to generate a square term of the cancellation polynomial and supply the square term to the third summing circuit;
a cube circuit to cube the first sum to generate a first cubed term; and
a fourth multiplier to multiply the first cube term by a third coefficient to generate a cube term of the cancellation polynomial and to supply the cube term to the third summing circuit.

\* \* \* \* \*